United States Patent [19]  [11] 4,367,385
Frame  [45] Jan. 4, 1983

[54] CAPACITANCE SWITCH

[75] Inventor: Norman J. Frame, Whitefish, Wis.

[73] Assignee: W. H. Brady Co., Milwaukee, Wis.

[21] Appl. No.: 228,118

[22] Filed: Jan. 26, 1981

[51] Int. Cl.³ .................... H01H 9/00; H01H 13/02
[52] U.S. Cl. ............... 200/159 B; 200/5 A;
  200/292; 340/365 C
[58] Field of Search .............. 200/159 B, 5 A, 292,
  200/284; 340/365 C

[56] References Cited
U.S. PATENT DOCUMENTS 3,492,440  1/1970  Cerbone et al. ............... 340/365 C
3,769,869  11/1973  Nelson ............................ 200/159 B
3,982,081  9/1976  Demler, Jr. ..................... 200/159 B
4,028,509  6/1977  Zurcher ............................ 200/292
4,088,994  5/1978  McNay ........................ 340/365 C
4,145,584  3/1979  Otterlei ............................ 200/292
4,153,987  5/1979  Boulanger ..................... 200/159 B
4,293,987  10/1981  Gottbreht et al. ........... 200/DIG. 1

FOREIGN PATENT DOCUMENTS 2822847  11/1978  Fed. Rep. of Germany ... 340/365 C
1454805  11/1976  United Kingdom ........... 200/159 B Primary Examiner—Willis Little

[57] ABSTRACT

A capacitance-type membrane switch is provided in which it is practical to seal the switch against dust and fluid.

15 Claims, 11 Drawing Figures

CAPACITANCE SWITCH

FIELD OF THE INVENTION

This invention relates to capacitance-type switches.

BACKGROUND OF THE INVENTION

It is well known in the art to provide capacitance-type switches in which a movable key acts to increase capacitance, which change is then sensed for switching action.

SUMMARY OF THE INVENTION

I have discovered that an improved capacitance-type switch can be provided if an electrically integral capacitance spacing element is provided over a plurality of switch zones.

In another aspect of my invention, I had found that membrane capacitance-type switches may be usably and desirably provided.

In preferred embodiments of my invention, I provide at one end of the capacitance spacer a folded-over portion; I use a screened insulating epoxy resin as a mechanical spacer; and I use a layer comprising indium to facilitate electrical connecting.

Devices according to my invention have many advantages. Because the area of the capacitance spacer element is increased, the difference between unactuated and actuated capacitance is greater, for a greater signal-to-noise ratio. Furthermore, in its membrane switch aspect there is provided a sealed capacitance-type switch, protected against dust and vapors. Long life is provided. Because current flows can be made extremely small, not only can much smaller quantities of metal be used for conductors and contacts, but less expensive, non-precious metals may be used for the most part. Other advantages will appear in the following discussion.

PREFERRED EMBODIMENT

I turn now to a presently preferred embodiment of the invention.

Drawings

There is shown:

DESCRIPTION

Turning now to the drawings, there is shown a membrane switch (i.e., a switch in which a flexible layer is flexed in order to produce a signal output) in which the signal output is produced by a large change in capacitance.

The device may perhaps be most understandably explained by an initial description of how it is made.

Figure 3A:
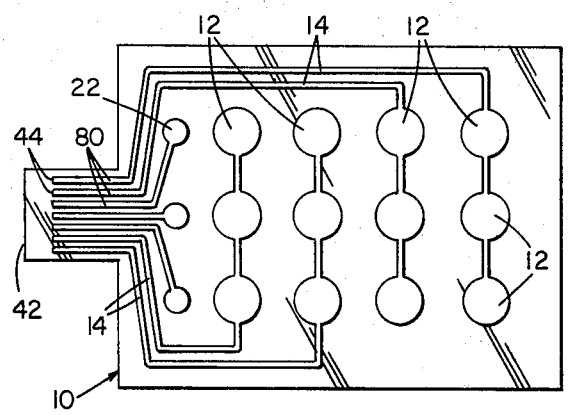
FIGS. 3A through 3G illustrate steps in the manufacture of said preferred embodiment.

There is shown in FIG. 3A a bottom plan view of top layer 10. It comprises 5-mil thick transparent polyester layer 10, on the bottom surface of which has been vacuum deposited thereon through a suitable mask a multiplicity of round pads 12 and conductors 14, of copper, 1500 Ångstrom units thick.

Figure 3B:
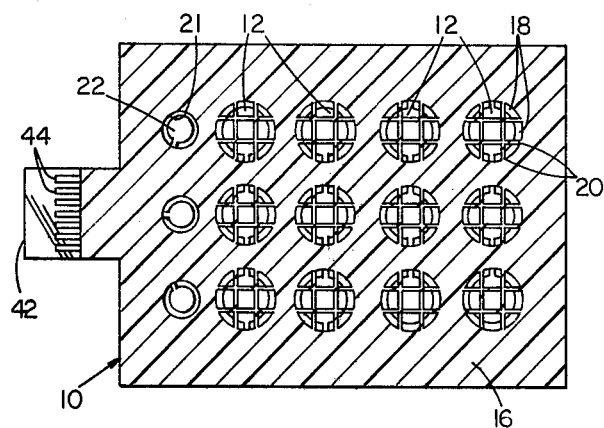

FIG. 3B is a bottom view of said top layer 10 showing positioned over the surface, including the pads and connectors, illustrated in FIG. 3A, a layer 16 of insulating epoxy (one mil thick), ultraviolet curable and capable (like the other elements of the switch) of withstanding elevated temperature and humidity (e.g., 85° C. and 85% R.H.), screened through a mask prior to curing, and including a multiplicity of zones 18 in which, corresponding with the locations of pads 12, the epoxy is laid down, not in an uninterrupted layer as throughout most of the device, but in sets of grid lines 20. The layer of epoxy is also relieved at three areas 21, corresponding with the location of contact areas 22 (shown in FIG. 3A).

Figure 3C:
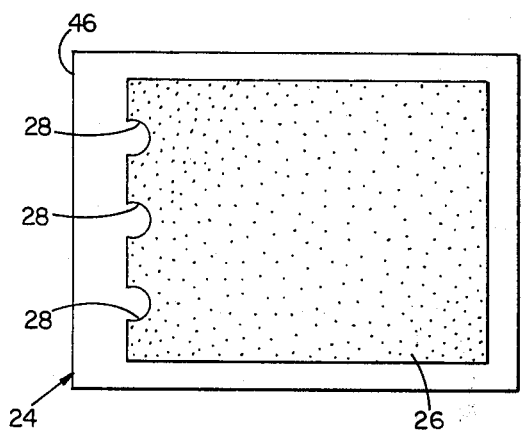

FIG. 3C is a plan view of bottom layer 24, also of five mil thickness transparent polyester film, on which has been deposited, through a mask, a ½-mil thick layer 26 of pressure-sensitive acrylic adhesive, interrupted by generally circular zones 28 corresponding to the locations of conducting pad zones 22 on the top layer 10.

Figure 3D:
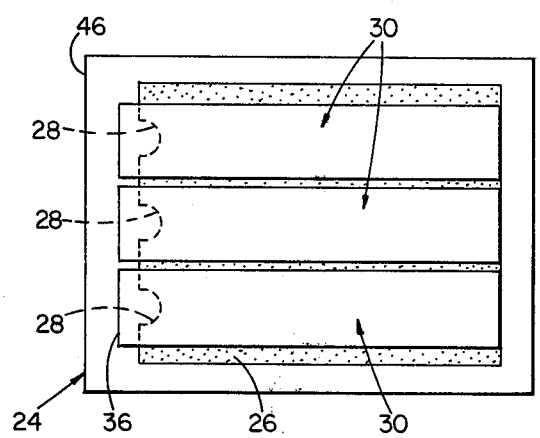

FIG. 3D is a plan view of the bottom layer 24 following the next step in the manufacturing process, namely, the assembly of the three elongated capacitance spacing element strips 30, which are held in place by adhesive layer 26, and are formed from ¼-mil polyester on each outer surface of which is vacuum deposited by RF sputtering layers 1000 Ångstrom units in thickness of aluminum.

Figure 3E:
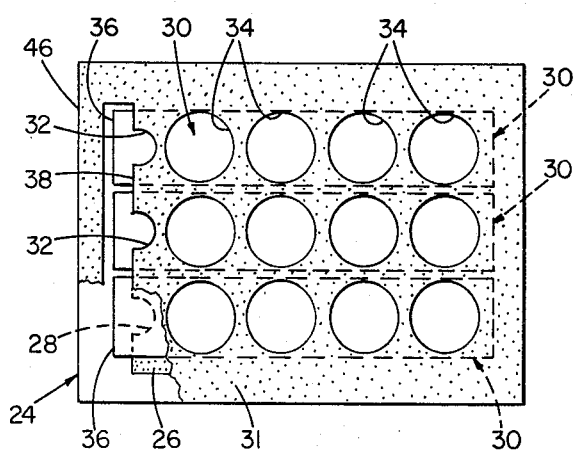

FIG. 3E is a plan view of bottom layer 24 after the next step in manufacture of the device. In this step there is deposited through a mask, over the area indicated in dots, a layer 31 of acrylic pressure-sensitive adhesive one mil in thickness. As shown in the drawings, this step leaves uncoated areas 32 corresponding to the contact areas 22 in top element 10 and areas 34 corresponding to the pads 12 of element 10.

Figure 1:
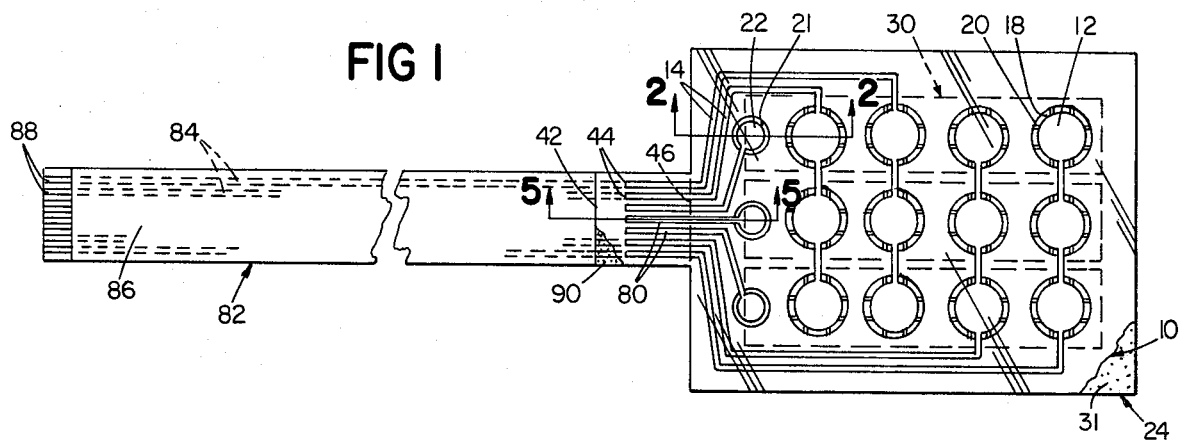
FIG. 1 is a plan view of a preferred embodiment of the invention.
Figure 2:
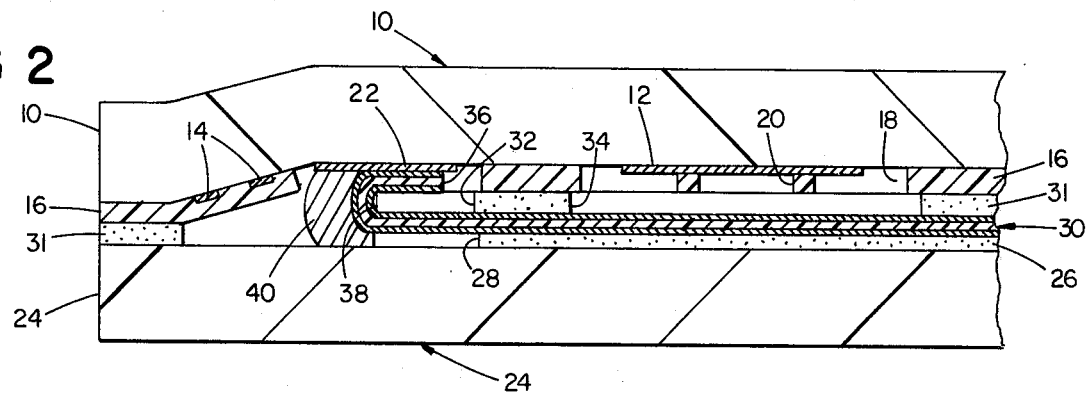
FIG. 2 is an enlarged cross-sectional view, taken at 2—2 of FIG. 1.
Figure 3F:
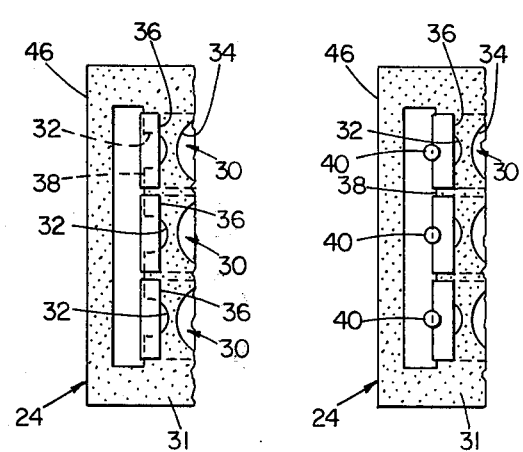
Figure 3G:
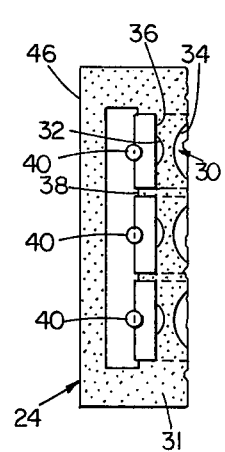

The step just described leaves extending freely the tips 36 of strips 30. These tips are then folded up around edges 38 of adhesive layer 31, as illustrated in FIG. 3F, as well as in FIG. 2. Dots 40 of a silver filled conductive epoxy (Amicon 3050, sold by Amicon Corporation of Lexington, Mass.) are then deposited along the fold line of the capacitance spacing element strips 30, to supplement conductivity through the outer aluminum layers of capacitance spacing element strips 30 and make contact with pads 22.

Figure 5:
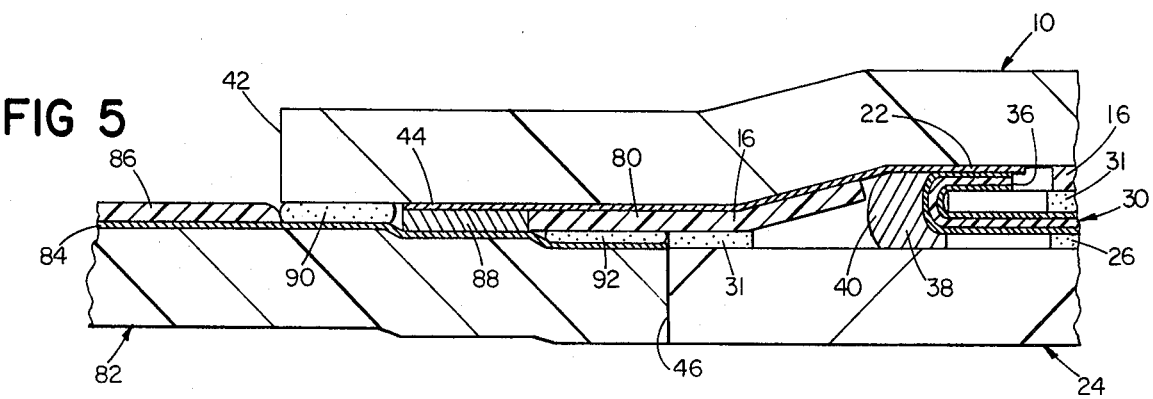
FIG. 5 is an enlarged sectional view, taken at 5—5 of FIG. 1, through the joint between the tail and tail extender.

The steps thus far described are carried out on the top and bottom elements (to be assembled into the switch) separately, and while each is part of a web of greater width than the final width dimension of the switch. In the top element, portions to define the tail 42 are cut out before the upper and lower portions are assembled. Also before assembly, a cut is made to define edge 46 of the lower portion as well as a window of which the edge 46 is one of the four sides to permit movement therethrough for soldering of tail 42. They are then assembled, and held together by adhesive layer 31. Next they pass over a roller which causes tail 42 to extend in a direction facilitating adding thereto, over the conductor areas 44, by standard solder wave techniques, one mil thick layer of 50% indium-50% tin alloy. (This approach permits use of a very short integral tail, with consequent savings of expensive polyester; as long a tail as desired may then be attached through an alloy seal with a similar alloy on the tail extended; the seal can be simply effected by a pressure-heat step—50 psi at 125° Centigrade for half a second). The construction at the tail-extender joint is shown in FIG. 5, in which is seen switch top layer 10 bearing conductive tracks 80 and insulating layer 16, extending over switch bottom layer 24. Tail extender 82 initially carries copper track 84 protected with epoxy layer 86 and an indium-tin layer over the tracks at their ends to enable making the seal. The indium-tin layer 88 is created by fusion pursuant to pressure of the indium-tin layer carried by tail 42 and the indium-tin layer carried by extender 82. Adhesive strips 90 and 92 cooperate to aid in maintenance of the seal.

Figure 4:
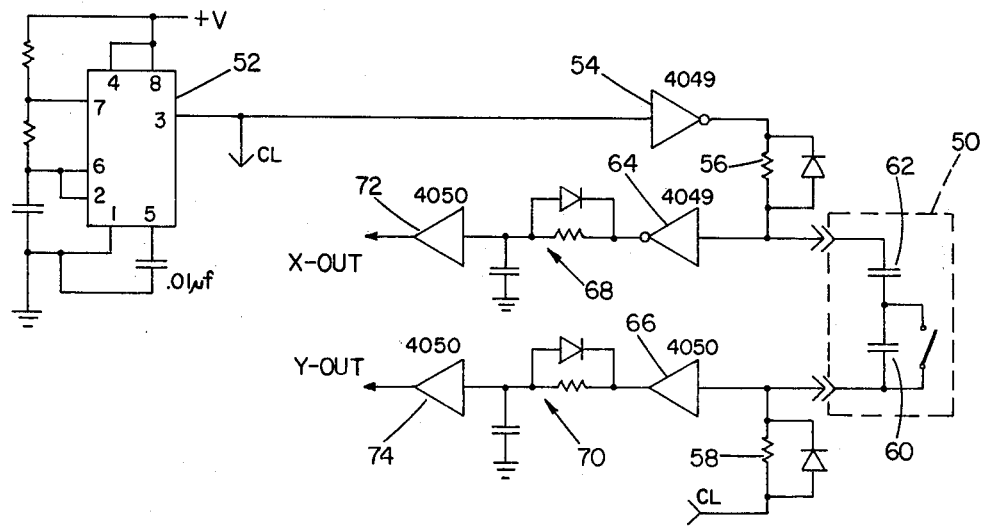
FIG. 4 is a circuit diagram of a detection circuit for said preferred embodiment.

A suitable detection circuit is disclosed in FIG. 4. A single switch shown as indicated at 50 corresponds to one of the 12 switching areas shown in the preferred embodiment. Clock 52 sends out square wave pulses at a frequency of 2 kHz through inverter 54 and resistance 56 into one side of switch 50 and simply through resistance 58 into the other. So long as the switch 50 is not actuated, so that both air capacitor 60 and polyester capacitor 62 are in the circuit, current flows through inverter 64 and transmission gate 66 are insufficient to transmit signals past RC networks 68 and 70. When the air capacitor 60 is taken out of the circuit by pressing the appropriate area, signals do pass RC networks 68 and 70, providing output signals at transmission gates 72 and 74, the former providing information, in the preferred embodiment, of the X position of the switch pressed, and transmission gate 74 providing similar information as to the Y position.

In operation, a pad 12 is pushed downwardly by flexing flexible layer 10, which carries it, until pad 12 engages a capacitance spacing element strip 30. (The amount of force required to do this may be regulated partially by the spacing of epoxy grid lines 20; the more closely spaced are the grid bars 20, the more difficult is it to push down layer 10 and pad 12 between them to engage capacitance spacing element strip 30.) This in effect eliminates one of two capacitors in series (the air capacitor 60), leaving the polyester capacitor, causing the capacitance of the circuit through this contact made to increase enormously. In the preferred embodiment just described the capacitance increases from 30 picofarads to 10 nanofarads—i.e., over three hundred times.

OTHER EMBODIMENTS

Other embodiments within the invention will occur to those skilled in the art. For example only, I mention a few. For the polyester layer producing the large capacitance could be substituted, for example, a deposited layer of tantalum pentoxide, which has a dielectric constant many times that of polyester. Instead of insulating epoxy a diecut polyester spacer could be used. Conductor areas could be made by printing or etching. The polyester capacitor strip could be folded on itself to produce increased capacitance. Instead of being constructed in the X-Y matrix disclosed the device could be a common ground one, with a separate lead coming off each conductive pad; here the other lead to all the pads might desirably be a single large capacitor spacer (as opposed to the three strips shown in the embodiment described). The entire device could be made transparent, so that it might be mounted on the face of a CRT. The substrate of the device could be made rigid. In another embodiment, the capacitor spacing layer is a single sheet substantially the size of the overall device and located in it below a layer carrying on it a plurality of X-row pads and beneath it a layer of Y-column pads, with spacers between the central layer and each of the other two.

OTHER INVENTIONS

The detection circuit disclosed herein is the invention of James P. Walber. The grid system described herein is the joint invention of Dr. Brian E. Aufderheide and the undersigned. Nor was the conception, broadly, of a tail extender, mine.

What is claimed is:

1. A membrane capacitance switch wherein switch activation produces a change in capacitance detectable by external circuitry, comprising:
   a substrate sheet,
   a flexible sheet extending over said substrate sheet,
   a conductive contact carried by one of said substrate sheet and said flexible sheet,
   a capacitance element located between said substrate sheet and said flexible sheet and aligned with said contact,
   said capacitance element comprising
      an inner insulating layer and
      first and second outer conductive portions on opposite surfaces of said inner insulating layer,
   said capacitance element forming a first capacitor,
   spacing means for spacing said capacitance element from said contact so as to provide an insulating zone between said contact and said first conductive portion,
   said contact, insulating zone, and first conductive portion being adapted to form a second capacitor electrically in series with said first capacitor,
   said flexible sheet, spacing means, contact, and first conductive portion all being adapted and located to cause the spacing between said contact and first conductive portion to vary when said flexible sheet is flexed during switch activation and to thereby cause the net capacitance of said first and second capacitors to change to an extent detectable by external circuitry, and
   said spacing means including one or more spacer layers occupying the space between said flexible layer and said capacitance element.

2. The membrane capacitance switch of claim 1 in which are provided a plurality of conductive contacts and in which an integral capacitance element extends over said plurality.

3. The membrane capacitance switch of claim 1 in which said inner insulating layer of said capacitance element comprises a layer of plastic and said outer conductive portions comprise layers of metal.

4. The membrane capacitance switch of claim 3 in which said plastic is polyester.

5. The membrane capacitance switch of claim 4 in which said metal is sputtered aluminum.

6. The membrane capacitance switch of claim 1 in which said capacitance element is carried by said substrate.

7. The membrane capacitance switch of claim 6 in which said capacitance element is secured with respect to said substrate by means of a layer of adhesive.

8. The membrane capacitance switch of claim 7 in which a spacer lies between said flexible sheet and said substrate and in which said capacitance element is bent around said spacer at an end thereof.

9. The membrane capacitance switch of claim 8 in which said capacitance element is adhered to said spacer on the side of said spacer away from said substrate.

10. The membrane capacitance switch of claim 8 in which said flexible sheet carries a contact pad engaging said capacitance element on its face away from said substrate.

11. The membrane capacitance switch of claim 1 comprising a plurality of said capacitance elements, each thereof extending over a plurality of conductive contacts.

12. The membrane capacitance switch of claim 8 in which a conductive element extends along said bent portion and to a second conductive contact carried by one of said substrate sheet and said flexible sheet.

13. The switch of claim 1 in which said inner insulating layer and said outer conductive portions are integral.

14. The switch of claim 1 wherein said first conductive portion is adapted to be electrically floating and isolated from external detection circuitry.

15. The switch of claim 1 wherein the insulating layer of said capacitance element has at least the dielectric properties of a 0.25 mil thick layer of polyester.

* * * * *